United States Patent
Bahary et al.

(10) Patent No.: US 9,473,177 B2
(45) Date of Patent: Oct. 18, 2016

(54) TURBO DECODER WITH A LOW-POWER INPUT FORMAT AND ASSOCIATED METHOD

(71) Applicant: Freescale Semiconductor, Inc., Austin, TX (US)

(72) Inventors: Robert Bahary, Arlington Heights, IL (US); Eric J Jackowski, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 44 days.

(21) Appl. No.: 14/555,309

(22) Filed: Nov. 26, 2014

(65) Prior Publication Data
US 2016/0149596 A1    May 26, 2016

(51) Int. Cl.
H03M 13/29       (2006.01)
G06F 11/10       (2006.01)
H03M 13/00       (2006.01)

(52) U.S. Cl.
CPC ...... *H03M 13/2957* (2013.01); *G06F 11/1076* (2013.01); *H03M 13/2978* (2013.01); *H03M 13/6505* (2013.01); *H03M 13/6561* (2013.01); *H03M 13/6563* (2013.01); *H03M 13/6566* (2013.01)

(58) Field of Classification Search
CPC .................................................. H03M 13/2957
USPC ................................ 714/755, 786, 796, 794
See application file for complete search history.

(56) References Cited

U.S. PATENT DOCUMENTS

| | | | | |
|---|---|---|---|---|
| 6,304,996 B1* | 10/2001 | Van Stralen | ...... | H03M 13/2957 714/794 |
| 6,594,792 B1* | 7/2003 | Hladik | .............. | H03M 13/2957 714/755 |
| 7,543,197 B2* | 6/2009 | Palanki | ............. | H03M 13/2757 714/701 |
| 8,495,455 B1* | 7/2013 | Zhang | ..................... | G06F 11/10 714/752 |
| 8,819,517 B1* | 8/2014 | Li | ..................... | H03M 13/3905 714/752 |
| 2007/0242781 A1 | 10/2007 | Galili et al. | | |

FOREIGN PATENT DOCUMENTS

WO    WO2010122210 A1    10/2010

OTHER PUBLICATIONS

3GPP standard 25.212, Universal Mobile Telecommunications System (UMTS), Multiplexing and channel coding (FDD), Technical Specification Group, Radio Access Network, version 10.1.0 Release 10, pp. 1-116, Dec. 2010.

* cited by examiner

Primary Examiner — Fritz Alphonse (57) ABSTRACT

A turbo decoder stores received data in words in systematic memory and parity memory in a way that is known that it will be used for later iterations by turbo decoder engines arranged to operate in parallel. A loader receives and separates LLRs into systematic and parity data and stores them into a portion of a word per cycle until a word is full in a corresponding one of the systematic memory and parity memory. The turbo decoder engines read the LLRs from one word of the systematic memory and one word of the parity memory in a single cycle. The data can be rearranged within the words in an order format for the turbo decoder engines to later read them by providing sub-words corresponding to respective ones of the plurality of turbo decoder engines.

21 Claims, 7 Drawing Sheets

TURBO DECODER WITH A LOW-POWER INPUT FORMAT AND ASSOCIATED METHOD

BACKGROUND OF THE INVENTIONS

1. Technical Field

Embodiments of the present invention relate to turbo decoders and, more particularly, relate to input memory management for a turbo decoder.

2. Description of the Related Art

Telecommunications involves sending information from a transmitter to a receiver. Channel coding is a process performed by the transmitter of adding extra information bits or redundant bits to the information to be sent. The receiver then uses the redundant bits to help it identify the sent message.

Typically signals are encoded before being sent to a cellular telephone using a way of encoding defined in cellular standards specifications. An encoder in the transmitter adds redundancy using a predetermined method and the decoder in the receiver uses this knowledge of the redundancy method to increase reliability of data demodulation and decoding. Typically high latency sensitive traffic signals such as voice are encoded using a convolutional coder and lower latency traffic signals such as data are encoded using a turbo encoder. While cellular standards specifications specify the requirement for turbo encoding a signal, these cellular standards specifications do not typically specify the operations for turbo decoding a signal. Turbo decoding is basically defined as the reverse process of turbo encoding.

Turbo encoding is one method of encoding by adding redundancy. A turbo encoder uses an interleaver to shuffle the bits into random order. The interleaving process increases the probability that errors introduced while the coded data is transmitted can be overcome and the original information reconstructed at the receiver. A turbo decoder is responsible for reversing the interleaving process. To unwind the interleaving procedure, it saves power to generate the desired bit's address in memory rather than move the data itself. The turbo decoder uses an iterative algorithm. The turbo decoder alternates between processing received samples relating to $(x_k, z_k)$ called even MAP estimates, and processing received samples relating to $z'_k$ called odd MAP estimates. The two MAP estimates are together called an iteration. For example, if the turbo decoder performs four iterations that means it would have processed 8 MAP estimates.

The turbo encoder and turbo decoder is an integral part of telecom standards with data rates reaching upwards of 100 Mbps (million bits per second). These high data rates create new demands on processing speed which require multiple bits to be processed in parallel. To achieve this, a parallel architecture of multiple turbo decoder engines is used. To further increase throughput, the input can be double buffered. In this architecture, one input buffer is loaded while the other is decoded. In this case, the interleaver addresses must be generated twice during a turbo decode operation; once during the load phase and once during the decode phase. There are two ways to turbo decode in parallel. A first way is to break a coded block into smaller sub-blocks, and process those in parallel. A second way is to process multiple coded blocks in parallel. The first approach increases decoding latency and input random access memory (RAM) requirements. The second approach may have problems with collisions. The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein:

DETAILED DESCRIPTION OF THE PREFERRED EMBODIMENTS

Figure 1:
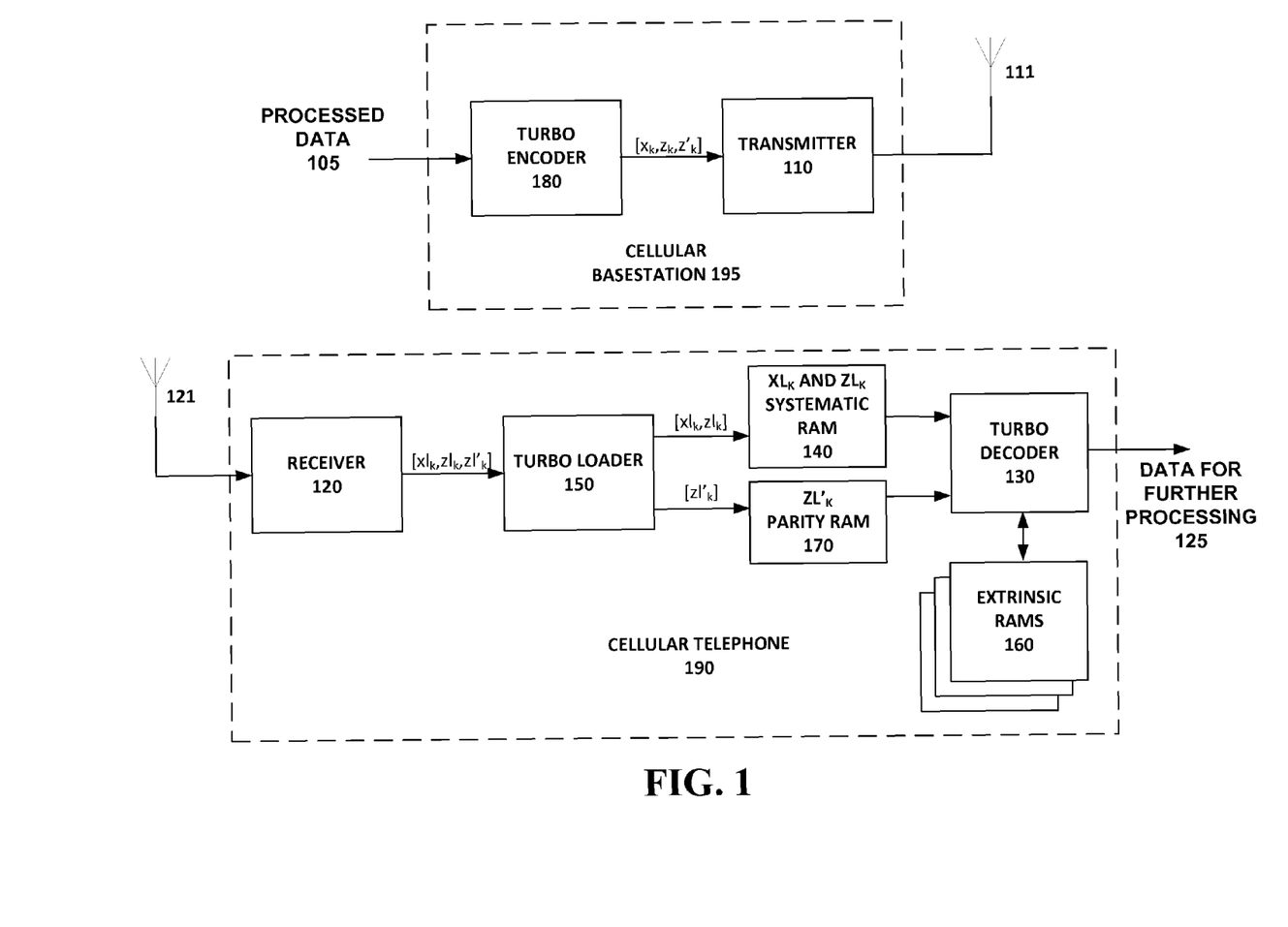
FIG. 1 illustrates a schematic block diagram of a turbo encoder and transmitter of an exemplary cellular base station and a radio receiver, a turbo loader, two input RAMs (random access memories), a turbo decoder, and extrinsic RAMs of an exemplary cellular telephone according to an exemplary embodiment of the present invention.

FIG. 1 illustrates a schematic block diagram of an exemplary cellular base station 195 and an exemplary cellular telephone 190 according to an exemplary embodiment of the present invention. A turbo encoder 180 and transmitter 110 are in the cellular base station 195 coupled to an associated antenna 111. The cellular base station 195 takes in voice or internet data and processes it. After some processing, the processed data 105 is sent to the turbo encoder in the cellular telephone 190.

The cellular telephone 190 has an antenna 121 coupled to a radio receiver 120, a turbo loader 150, $xl_k$ and $zl_k$ systematic input RAM 140, $zl'_k$ parity input RAM 170, a turbo decoder 130, and a plurality of extrinsic RAMs 160.

Systematic RAM 140 and parity RAM 170 store the received encoded data signal and make it available during the iterations processed by the turbo decoder 130. These so-called iterations can place heavy demands on the random access memory $xl_k$ and $zl_k$ systematic input RAM 140 and $zl'_k$ parity input RAM 170 and are performed by multiple turbo decoder engines within the turbo decoder 130.

The encoded data is initially received by the receiver 120 and written by the turbo loader 150 into the $xl_k$ and $zl_k$ systematic input RAM 140 or the $zl'_k$ parity input RAM 170. The turbo decoder 130 then reads the data out of the $xl_k$ and $zl_k$ systematic input RAM 140 or the $zl'_k$ parity input RAM 170 concurrently for each turbo decoder engine to arrive at a result for the bit transmitted. Power is burned every time the turbo decoder reads the $xl_k$ and $zl_k$ systematic input RAM 140 or the zl'$_k$ parity input RAM 170 when converting the format/location of the data during a read. This is because the xl$_k$ and zl$_k$ systematic input RAM 140 or the zl'$_k$ parity input RAM 170 is read multiple times, but only written to once. What is needed as an approach to reduce the power burned every time the turbo decoder reads the xl$_k$ and zl$_k$ systematic input RAM 140 or the zl'$_k$ parity input RAM 170.

It is better for turbo loader 150 to store received data in a format that requires the least amount of transformation during a read. It is also better to transform received data before storage to minimize transformations during a read. Example transformations include clipping, rearranging, scaling, and insertion of dummy bits. The loader 150 performs more transformations before a write to the xl$_k$ and zl$_k$ systematic input RAM 140 and the zl'$_k$ parity input RAM 170 than transformations after a read from the xl$_k$ and zl$_k$ systematic input RAM 140 and the zl'$_k$ parity input RAM 170 because of the way the loader 150 rearranges data for storage in xl$_k$ and zl$_k$ systematic input RAM 140 and the zl'$_k$ parity input RAM 170. Likewise, the loader 150 performs more transformations before a write to the zl'$_k$ parity input RAM 170 than transformations after a read from the zl'$_k$ parity input RAM 170 because of the way the loader 150 rearranges data for storage in zl'$_k$ parity input RAM 170. Also, more read operations from the xl$_k$ and zl$_k$ systematic input RAM 140 are performed than the loader 150 performs write operations and more read operations from the zl'$_k$ parity input RAM 170 are performed than the loader 150 performs write operations.

The present invention addresses and reduces the high amount of power needed to read systematic (x$_k$) and parity (z$_k$ and z'$_k$) input data into a turbo decoder. The present invention reorders the input data during the loading phase to save turbo decoder power.

One important problem improved by the present invention is a high amount of power needed for turbo decoding. Since the turbo decoder is an iterative algorithm, the input data will be written once, and read many times. In order to reduce power, receiver outputs in the xl$_k$ and zl$_k$ systematic input RAM 140 and the zl'$_k$ parity input RAM 170 are stored in a way that is optimum for reading by the turbo decoder. To further reduce power, we note that even MAP estimates use only x$_k$ and z$_k$, and odd MAP estimates use z'$_k$. When a separate RAM is used to store x$_k$ and z$_k$ distinct from z'$_k$, then only one of the two RAMs will be used during a MAP, thus saving power. More specific and detailed explanation will later be given with respect to the below exemplary embodiments.

The radio receiver 120 and antenna 110 can be typical of that used in a portable cellular telephone 190 or other mobile cellular radio device. The receiver 120 demodulates a received signal and may descramble the signal depending on the cellular standards specification needed. Next the received signal is decoded. Depending on the type of signal received, a turbo loader 150 and a turbo decoder 130 is used to decode the demodulated received signal.

The cellular base station 195 takes in voice or internet data and processes it. After some processing, the data is sent to the turbo encoder 180. The turbo encoder 180 takes input bits x$_k$, and adds redundant information. A predetermined interleaving sequence is used to derive this redundant information. Both the encoder and the decoder are preprogrammed according to an agreed upon specification standard with the same predetermined interleaving sequence. This redundant information is labeled z$_k$ and z'$_k$, and will be shown in FIG. 2. The redundant information is added to the output of an encoder in order to help the decoder correct errors in the data x$_k$. The data and redundant information [x$_k$,z$_k$,z'$_k$] go through the transmitter 110 and over the air to the receiver 120.

Figure 2:
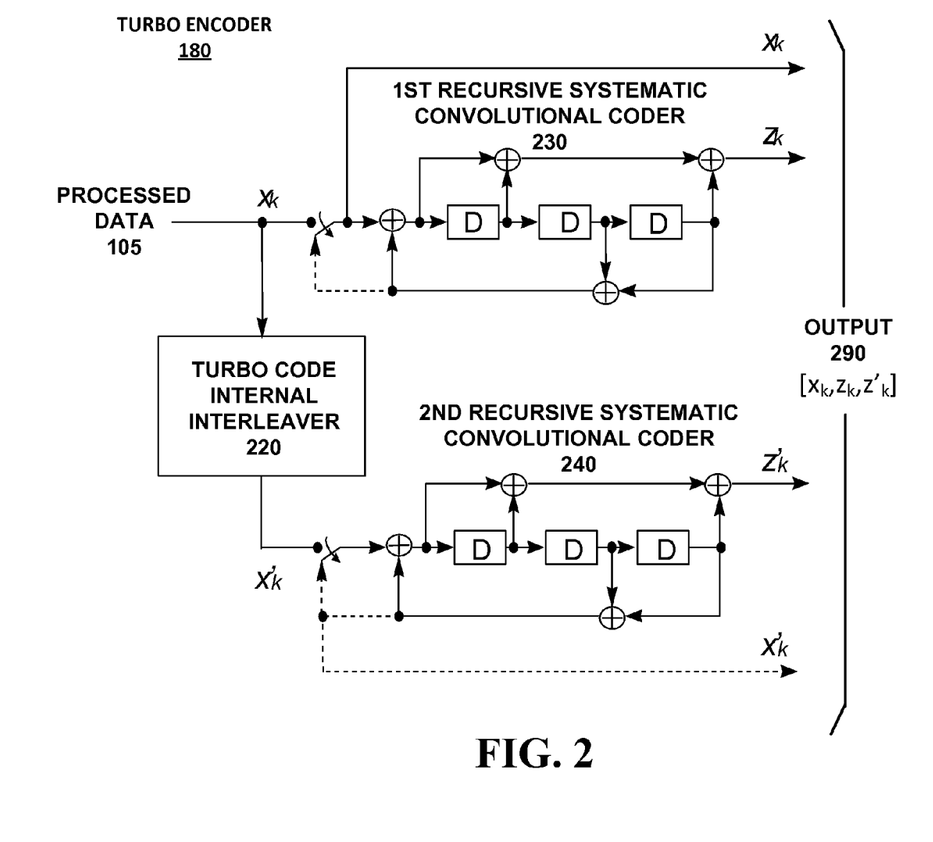
FIG. 2 illustrates a schematic block diagram of an exemplary turbo encoder relating to embodiments of the present invention.

FIG. 2 illustrates a schematic block diagram of an exemplary turbo encoder 180 relating to embodiments. The turbo encoder 180 encodes processed data 105. In FIG. 2, two turbo encoder paths are illustrated, one path for a first recursive systematic convolutional coder 230 and a second path for a second recursive systematic convolutional coder 240, after a turbo code interleaver 220. Each of the first recursive systematic convolutional coder 230 and the second recursive systematic convolutional coder 240 have the illustrated series of three delays and four feedback and feed forward modulo 2 adders. The output 290 of the turbo encoder 180 is x$_k$ (the input processed data 105), z$_k$ (result of the first recursive systematic convolutional coder 230), and z'$_k$ (result of the second recursive systematic convolutional coder 240). The output 290 of the turbo encoder 180 also has x'$_k$ which is used at the end of a processed data block to ensure the encoder ends in an all zero state.

Figure 3:
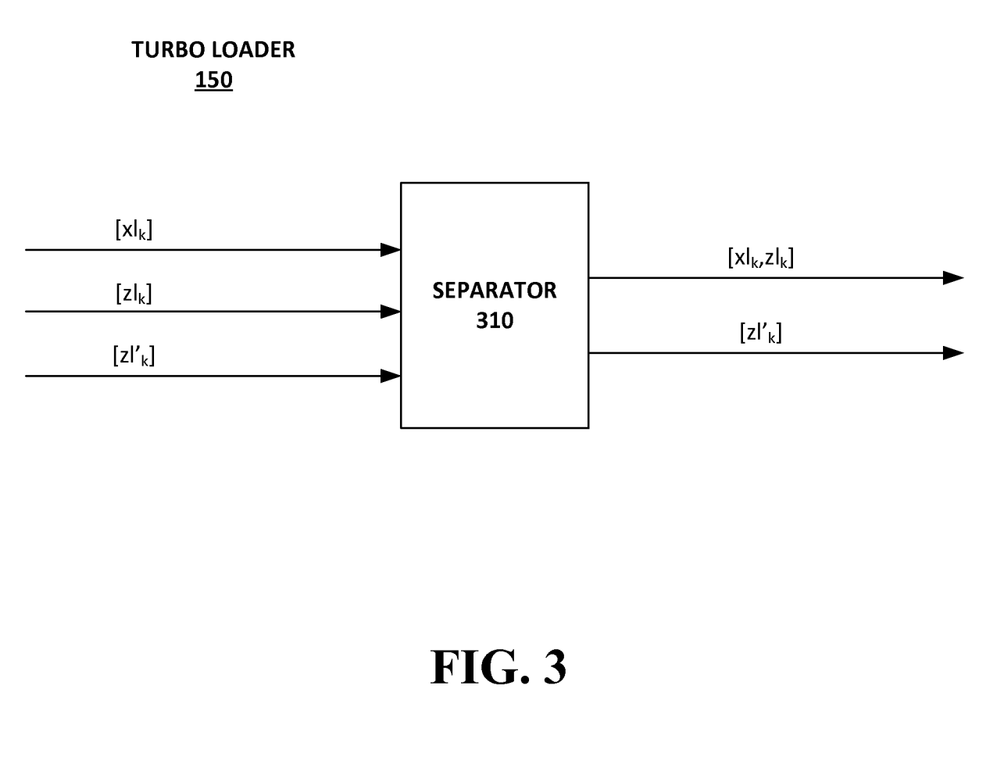
FIG. 3 illustrates a turbo loader according to an exemplary embodiment of the present invention.

FIG. 3 illustrates a turbo loader 150 according to an exemplary embodiment of the present invention. A separator 310 receives [xl$_k$,zl$_k$,zl'$_k$] from the receiver 120, preferably on three concurrent lines in parallel as illustrated.

For each transmitted bit received the receiver 120 computes a metric called the logarithm of the likelihood ratio (LLR). These LLRs are sent to the turbo decoder 130. An LLR and is defined as:

$$LLR = \ln(p(1)/p(0))$$

where
ln is the natural log,
p(1) is the probability the bit is a 1, and
p(0) is the probability the bit is a 0.
As illustrated in FIGS. 1 and 3,
xl$_k$ are the LLRs for the original x$_k$ bits,
zl$_k$ are the LLRs for the original z$_k$ bits, and
zl'$_k$ are the LLRs for the original z'$_k$ bits.

These [xl$_k$,zl$_k$,zl'$_k$] representing the LLRs are then received by the separator 310 of FIG. 3 from the receiver 120, preferably on three concurrent lines in parallel as illustrated. The turbo loader 150 receives logarithms of likelihood ratios (LLRs) from the receiver and separates them into systematic data and parity data. The separator 310 of the turbo loader 150 separates [xl$_k$, zl$_k$] from [zl'$_k$] and delivers them via the xl$_k$ and zl$_k$ systematic input RAM 140 and the zl'$_k$ parity input RAM 170 to the turbo decoder 130, preferably on two concurrent lines in parallel as illustrated.

The turbo loader 150 writes [xl$_k$, zl$_k$] to a sub-word of the xl$_k$ and zl$_k$ systematic input RAM 140, and zl'$_k$ to a sub-word of the zl'$_k$ parity input RAM 170. The turbo loader 150 writes only a single index of k, even though there are multiple indexes of k at a single RAM address. Over time additional data is received as k increments. As the receiver 120 sends higher indexes of k, the entire RAM address will become completely filled. The separated systematic data and parity data are stored by the turbo loader 150 into a portion of one of the words per cycle to fill the words over the cycles with the portions in a corresponding one of the xl$_k$ and zl$_k$ systematic input RAM 140 and the zl'$_k$ parity input RAM 170.

Figure 4:
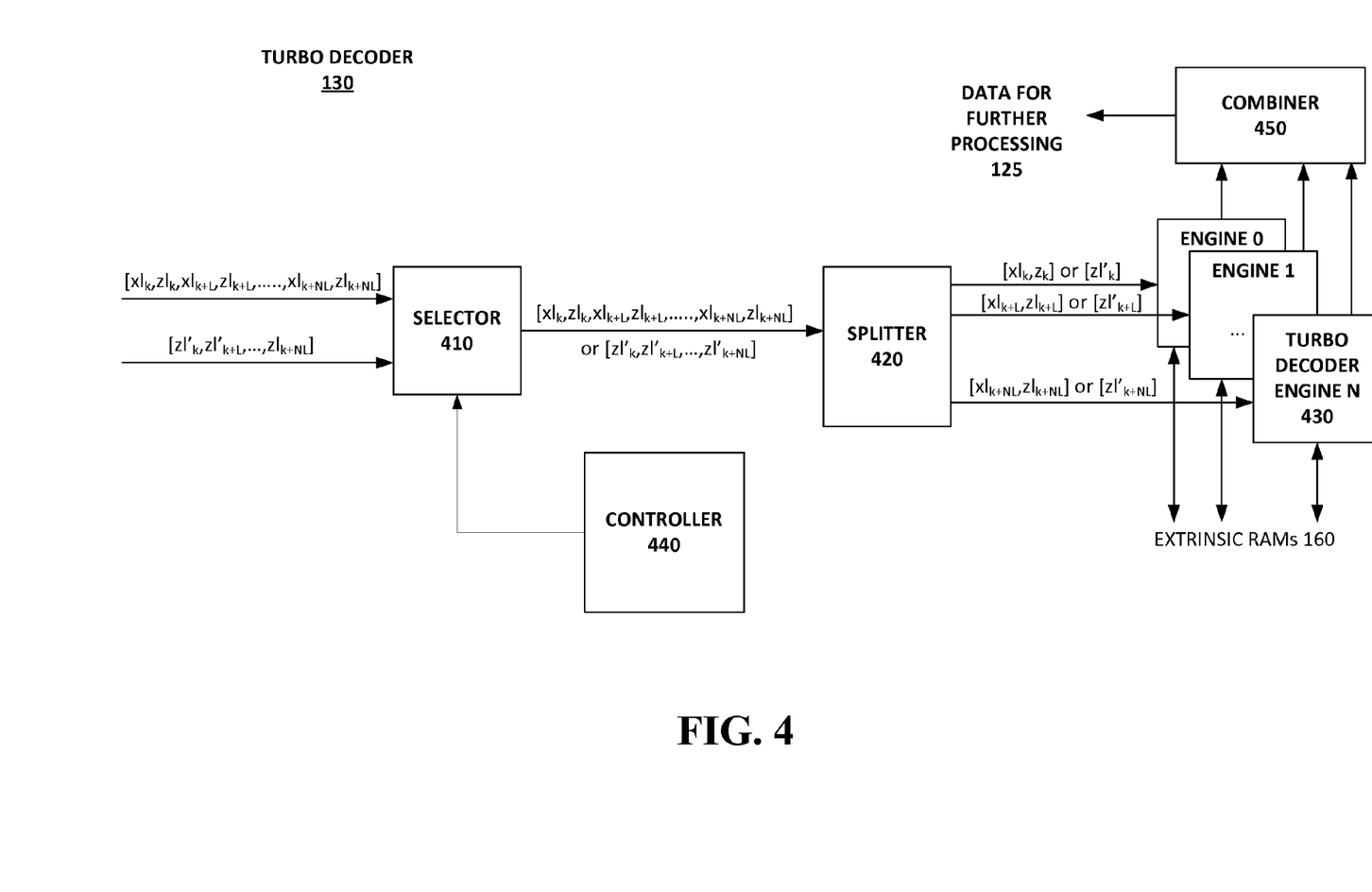
FIG. 4 illustrates a turbo decoder according to an exemplary embodiment of the present invention.

FIG. 4 illustrates a turbo decoder 130 according to an exemplary embodiment of the present invention. To reach high data rates, the turbo decoder 130 is a parallel architecture consisting of multiple turbo decoder engines 430. The selector 410 reads words from the systematic RAM during even MAP estimates, and the parity RAM during odd MAP estimates. The splitter 420 separates the words read into sub-words. Each sub-word is processed by a respective turbo decoder engine 430. The output of the turbo decoder 130 provides the processed data 125 via a combiner 450. In embodiments of the present invention, the splitter 420 performs little or no transformations after reads from the $xl_k$ and $zl_k$ systematic input RAM 140 and the $zl'_k$ parity input RAM 170 because more work is done by the loader 150.

The turbo decoder 130 operates on an iterative algorithm. The turbo decoder 130 uses the input LLRs $[xl_k, zl_k]$ to create a metric called an "extrinsic" for each encoder transmit bit $x_k$. The turbo decoder 130 then improves the extrinsics, by using the previous extrinsics and $zl'_k$. The process of computing the extrinsic values is called a MAP (Maximum A Posterior) estimate. The turbo decoder 130 alternates between MAP processing using $[xl_k, zl_k]$ and MAP processing using $zl'_k$. For convenience of notation the first MAP estimate is labeled "MAP 0", the second is labeled "MAP 1." Therefore, the even MAP estimates use $[xl_k, zl_k]$, and the odd MAP estimates use $zl'_k$. The selector 410 chooses $[xl_k, zl_k]$ for even MAP estimates, and $zl'_k$ for odd MAP estimates.

In order to increase decoding throughput, the sequence from the receiver 120 is broken into sub-blocks of length L. The turbo decoder 130 contains multiple turbo decoder engines 430 that operate in parallel. Each of the turbo decoder engines 430 processes one of these a sub-block in parallel. Each of the turbo decoder engines 430 reads the previous MAP estimates extrinsics from extrinsic RAM 160, improves them based on the LLRs from the $xl_k$ and $zl_k$ systematic input RAM 140 and the $zl'_k$ parity input RAM 170, and writes the updated extrinsics back to extrinsic RAM 160. Once the extrinsics meet some quality criterion, or other stopping criterion, the extrinsics are converted to bits that are sent on an output of the turbo decoder 130 as data for further processing 125. It is the goal of this system that the bits of the data sent for further processing 125 are identical to the processed data 105 that was originally encoded.

The data transmitted undergoes an interleaving process which increases the probability that errors introduced while the coded data is transmitted can be overcome and the original information reconstructed at the receiver. To achieve this, interleaving creates a matrix and performs intra-row permutations followed by inter-row permutations. The interleaver matrix size can be larger than the actual input size. In this case, dummy bits or dummy entries are inserted into the matrix and then removed before transmitting.

On the receiver side, the turbo decoder interleaver must find the position of these dummy entries. The input LLRs are stored in memory and the dummy entries exist at out-of-bounds interleaver addresses in memory. These addresses must be detected dynamically in order to disable the downstream logic during a turbo decode phase. The generation of the interleaver addresses involves solving multiple equations, such as, by way of example, in from the 3GPP 25.212 standard, section 4.2.3.2.3 "Turbo code internal interleaver."

Figure 5:
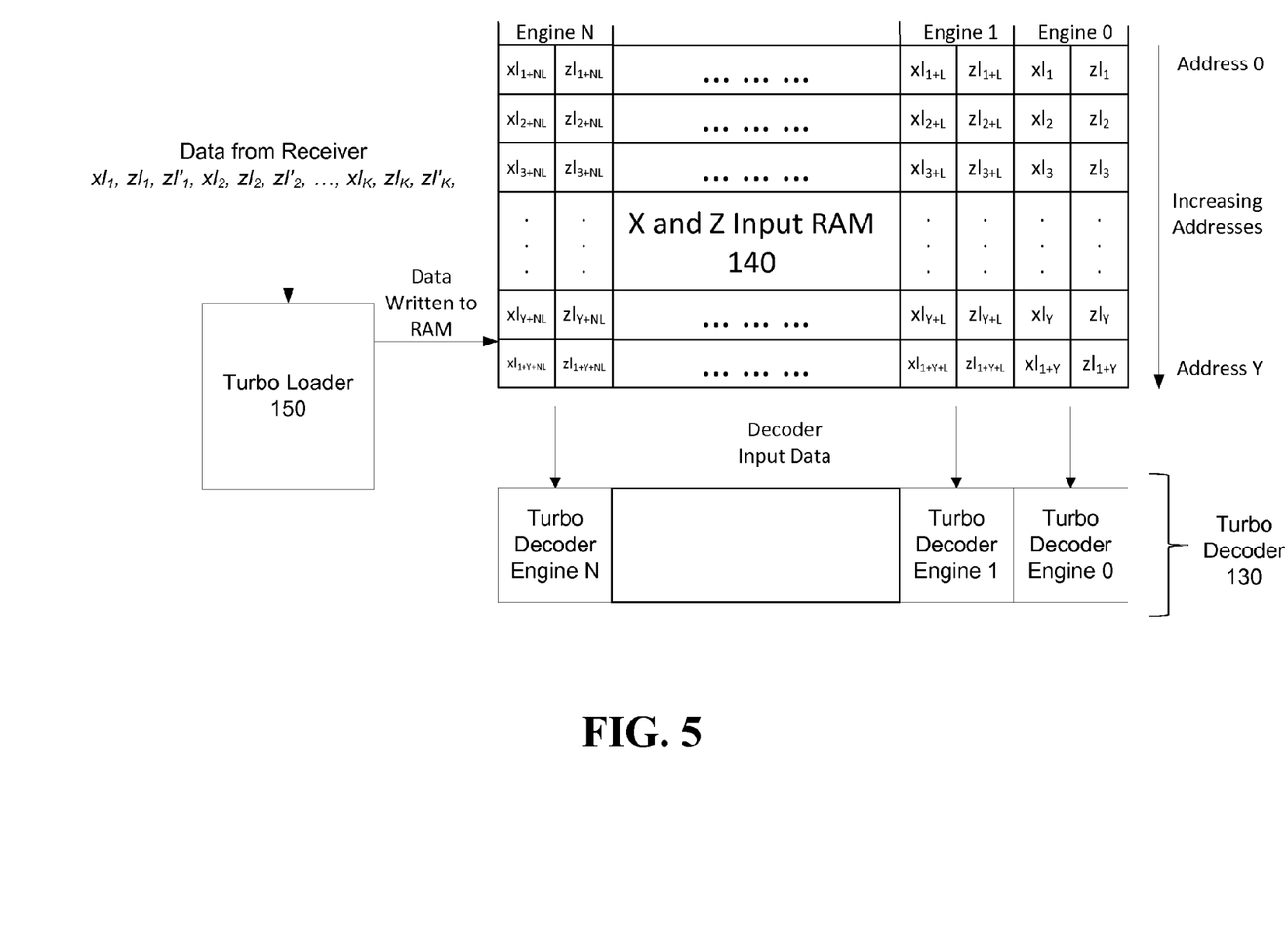
FIG. 5 illustrates a memory diagram of a random access memory coupled to the turbo loader unit and a plurality of turbo decoder engines for storing $xl_k$ and $zl_k$ inputs according to an exemplary embodiment of the present invention.
Figure 6:
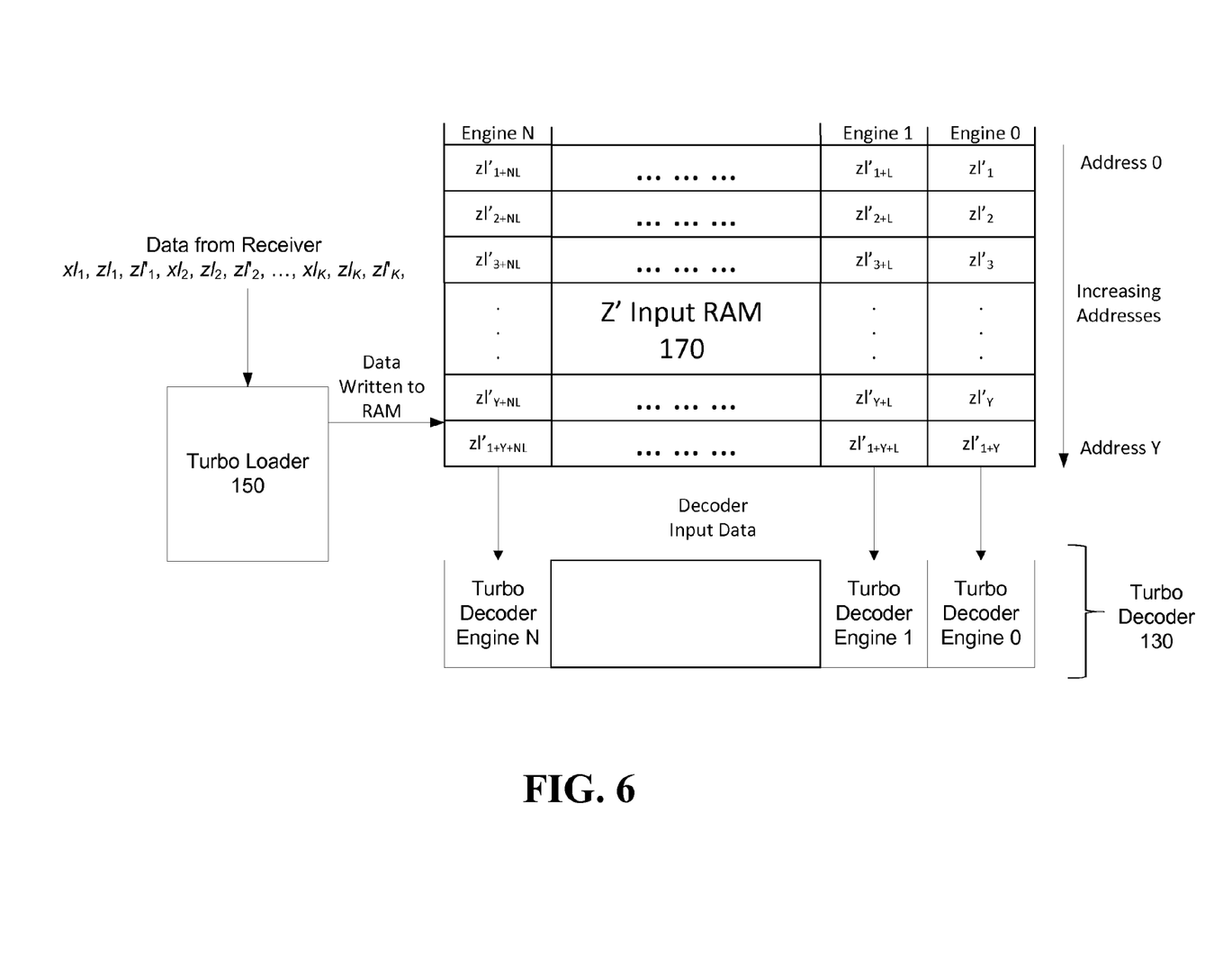
FIG. 6 illustrates a memory diagram of a random access memory coupled to a turbo loader unit and a plurality of turbo decoder engines for storing $zl'_k$ inputs according to an exemplary embodiment of the present invention.

FIGS. 5 and 6 illustrates memory diagrams of a random access memory 140 and 170 coupled to the turbo loader 150 and a plurality of turbo decoder engines of a turbo decoder 130 for storing inputs according to an exemplary embodiment of the present invention. The random access memory 140 and 170 in the embodiments of FIGS. 5 and 6 can correspond to the $xl_k$ and $zl_k$ systematic input RAM 140 and the $zl'_k$ parity input RAM 170 in the embodiment of FIG. 1. In FIG. 5 random access memory 140 is coupled to the turbo loader 150 and a plurality of turbo decoder engines of a turbo decoder 130 for storing $xl_k$ and $zl_k$ inputs. In FIG. 6 random access memory 170 is coupled to a turbo loader unit 150 and a plurality of turbo decoder engines of a turbo decoder 130 for storing $zl'_k$ inputs.

The turbo decoder performs many MAP estimates on the input data. Each turbo decoder engine must read the RAM for data to decode for every MAP estimate. During even MAP estimates the $x_k$ and $z_k$ values are read from RAM 140, and during the odd MAP estimates just the $z'_k$ data is read from 170. Loading the $x_k$ and $z_k$ into one RAM, and the $z'_k$ into another RAM saves power because one of these two RAMs will be made idle during each MAP estimate and not used. If the data was stored in the RAM in the order it was received, $x_1, z_1, z'_1, x_2, z_2, z'_2, \ldots, x_K, z_K, z'_K$, then during an even MAP estimate the $z'$ would be thrown out. This would waste power. Similarly, during the odd MAP estimates the $x$ and $z$ values would be thrown out. This embodiment of the present invention tends to store the data in RAM in the order it will be read.

In addition, the input LLRs in the $x_k$ and $z_k$ RAM 140 is organized as shown in FIG. 5. Each turbo decoder engine processes LLR indexes that are sub-block size (L) apart. The turbo loader 150 loads data into the RAM 140 such that a single address contains all the required data for every turbo decoder engine in a single cycle. For example, a turbo decoder with 10 turbo decoder engines, and an LLR width of 4 bits, the RAM word would be 10*4*2=80 bits wide. The RAM address 0 bits [3:0] would be the $x_1$ value used by engine 1, bits [7:4] would be the $z_1$ value used by engine 1, and so on. If the turbo decoder does 20 MAP estimates, then this RAM will be read 10 times (even MAP estimates only), but only written once. So re-ordering the data during the write is more power efficient.

Similarly, the input LLRs in the $z'_k$ RAM 170 are organized as shown in FIG. 6. In the RAM 170 only the $z'$ values are stored. Each turbo decoder engine processes input indexes that are sub-block size (L) apart. The turbo loader 150 loads data into the RAM 170 such that a single address contains all the required data for every turbo decoder engine in a single cycle. For example, a turbo decoder with 10 engines, and an LLR width of 4 bits, the RAM word would be 10*4=40 bits wide. RAM address 0 bits [3:0] would be the $z'_k$ value used by engine 1, bits [7:4] would be the $z_{1+K}$ value used by engine 2, and so on. Again, re-ordering the data during the write is more power efficient.

Although the embodiments of FIGS. 5 and 6 assume one turbo encoded output is processed per cycle, however, the present invention applies to multiple turbo encoded outputs processed per cycle. In this case the address 0 of the RAM would contain $x_1, x_2, z_1, z_2$ for engine 1, and $x_{K+1}, x_{K+2}, z_{K+1}, z_{K+2}$ for engine 2, and so forth.

It is desirable to have no gaps in between sub blocks. In order to accomplish this, the address Y in FIGS. 5 and 6 must be equal to L−1. In addition, in cases where there are more than N+1 sub blocks, the diagrams in FIGS. 5 and 6 can be repeated in addresses after Y.

Figure 7:
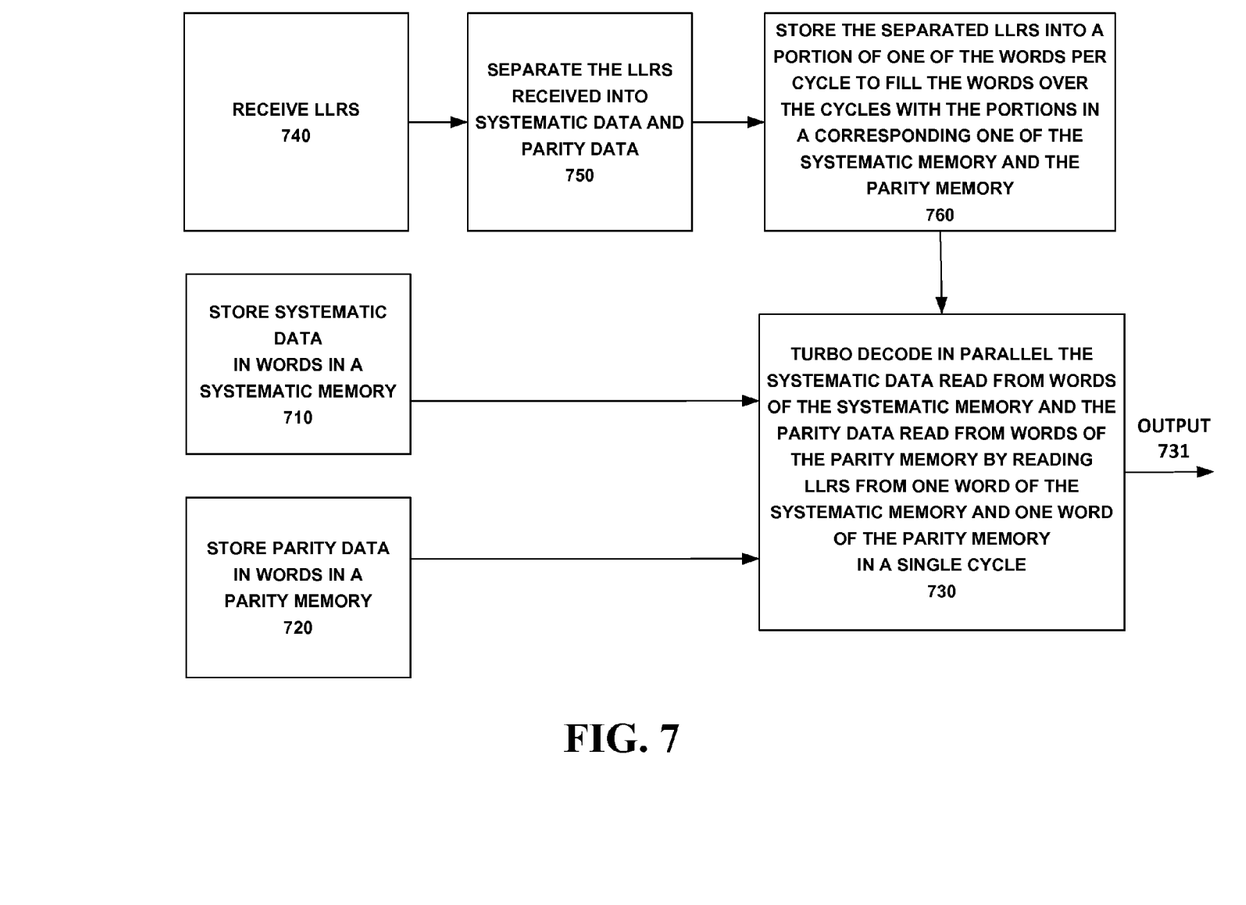
FIG. 7 illustrates a flow diagram of a process performed by turbo decoder engines and memory according to an exemplary embodiment of the present invention.

FIG. 7 illustrates a flow diagram of a process performed by turbo decoder engines and memory according to an exemplary embodiment of the present invention. In step 710, systematic data is stored in words in a systematic memory. In step 720, parity data is stored in words in a parity memory. Step 730 turbo decodes in parallel the systematic data read from words of the systematic memory and the parity data read from words of the parity memory by reading LLRs from one word of the systematic memory and one word of the parity memory in a single cycle. An output 731 of the turbo decoder is provided from step 730. The LLRs read by the turbo decoding of step 730 will be received and stored as provided by steps 740 through 760. In step 740, the LLRs are received. In step 750, the LLRs received in step 740 are separated into systematic data and parity data. In step 760 the LLRs separated in step 740 are stored into a portion of one of the words per cycle to fill the words over the cycles with the portions in a corresponding one of the systematic memory and the parity memory.

While the turbo decoder in the embodiments of the present invention can be used by any methods or apparatus, the turbo decoder in the embodiments of the present invention can be used by any methods or apparatus that use a 3GPP interleaver in the turbo encoding process such as Group System for Mobile communications (GSM), Universal Mobile Telecommunications System (UMTS) or High-Speed Downlink Packet Access (HSDPA).

An embodiment of a turbo decoder includes a systematic memory, a parity memory, a plurality of turbo decoder engines, and a loader. The systematic memory stores systematic data in words. The parity memory stores parity data in words. The plurality of turbo decoder engines are arranged to operate in parallel on the systematic data read from words of the systematic memory and the parity data read from words of the parity memory. The loader receives logarithms of likelihood ratios (LLRs) from a receiver, separates the LLRs into systematic data and parity data, and stores the LLRs so separated into a portion of one of the words per cycle to fill the words over the cycles with the portions in a corresponding one of the systematic memory and the parity memory. The plurality of turbo decoder engines read the LLRs from one word of the systematic memory and one word of the parity memory in a single cycle.

According to a further embodiment, the loader rearranges within the words in an order format for the turbo decoder engines to later read the words by providing the LLRs required for each of the turbo decoder engines.

According to a further embodiment, the splitter performs more read operations from the systematic memory than the loader performs write operations and the splitter performs more read operations from the parity memory than the loader performs write operations.

According to a further embodiment, the loader performs more transformations before a write to the systematic memory than the splitter performs transformations after a read from the systematic memory because of the way the loader rearranged data for storage in the systematic memory and the loader performs more transformations before a write to the parity memory than the splitter performs transformations after a read from the parity memory because of the way the loader rearranged data for storage in the parity memory.

According to a further embodiment, the turbo decoder further includes a splitter operatively coupled to the systematic memory and the parity memory for reading therefrom and splitting so read systematic data and parity data into sub-words corresponding to respective ones of the plurality of turbo decoder engines.

According to a further embodiment, the loader rearranges the LLRs before writing them to the systematic memory and the parity memory in a way optimized for efficient read operations for processing by the turbo decoder engines.

According to a further embodiment, the loader stores the LLRs into a corresponding one of the systematic memory and the parity memory rearranged within rows and at row addresses in a form and order for the turbo decoder engines to later read them optimized for maximum a posterior (MAP) processes.

According to a further embodiment, the turbo decoder calculates extrinsics during even and odd maximum a posterior (MAP) processes that occur at different times and, during even and odd maximum a posterior (MAP) processes, one of the systematic memory and the parity memory is idle.

An embodiment of a method decodes encoded data. The systematic data is stored in words in a systematic memory. The parity data is stored in words in a parity memory. Both the systematic data read from words of the systematic memory and the parity data read from words of the parity memory and decoded in parallel. Logarithms of likelihood ratios (LLRs) are received. The LLRs received are separated into systematic data and parity data and the LLRs so separated are stored into a portion of one of the words per to fill the words over the cycles with the portions in a corresponding one of the systematic memory and the parity memory, and the LLRs are read for decoding from one word of the systematic memory and one word of the parity memory in a single cycle.

According to a further embodiment, the separating includes rearranging the LLRs within the words in an order format for the parallel decoding to later read the words by providing the LLRs required by each parallel decoding.

According to a further embodiment, the separating performs more read operations from the systematic memory than performs write operations and performs more read operations from the parity memory than performs write operations.

According to a further embodiment, the separating performs more transformations before a write to the systematic memory than performs transformations after a read from the systematic memory and performs more transformations before a write to the parity memory than performs transformations after a read from the parity memory, because of the ways it rearranges data for storage in the systematic memory and in the parity memory.

According to a further embodiment, the method includes splitting systematic data and parity data read from the systematic memory and the parity memory into sub-words corresponding to the respective parallel decoding.

According to a further embodiment, the separating rearranges the LLRs before writing them to the systematic memory and the parity memory in a way optimized for efficient read operations for processing by the decoding.

According to a further embodiment, the separating stores the LLRs into a corresponding one of the systematic memory and the parity memory rearranged within rows and at row addresses in a form and order for the decoding to later read them optimized for maximum a posterior (MAP) processes.

According to a further embodiment, the decoding calculates extrinsics during even and odd maximum a posterior (MAP) processes that occur at different times.

According to a further embodiment, the method includes idling one of the systematic memory and the parity memory during even and odd maximum a posterior (MAP) processes to save power.

The signal processing techniques disclosed herein with reference to the accompanying drawings can be implemented on one or more digital signal processors (DSPs) or other microprocessors. Nevertheless, such techniques could instead be implemented wholly or partially as hardwired circuits. The RAM could refer to a physical RAM instance in silicon, or a buffer in a DSP. While a random access memory RAM is one preferred embodiment, any addressable memory can be used such as flash or latches or flip flops. Further, it is appreciated by those of skill in the art that certain well known digital processing techniques are mathematically equivalent to one another and can be represented in different ways depending on choice of implementation.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. They can have different configurations than the examples illustrated in the drawings. Any benefits, advantages, or solutions to problems that are described herein with regard to specific embodiments are not intended to be construed as a critical, required, or essential feature or element of any or all the claims.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A turbo decoder, comprising
   a systematic memory configured to store systematic data in first words;
   a parity memory configured to store parity data in second words;
   a plurality of turbo decoder engines operatively coupled to the systematic memory and the parity memory and arranged to operate in parallel on the systematic data read from the first words of the systematic memory and the parity data read from the second words of the parity memory; and
   a loader operatively coupled to the systematic memory and the parity memory and configured to receive logarithms of likelihood ratios (LLRs) from a receiver, separate the LLRs into systematic data and parity data, and store the systematic data into a portion of one of the first words per cycle to fill the first words in the systematic memory over the cycles, and store the parity data into a portion of one of the second words per cycle to fill the second words in the parity memory over the cycles; and
   wherein the plurality of turbo decoder engines read the LLRs from one word of the systematic memory and one word of the parity memory in a single cycle.

2. A turbo decoder according to claim 1, wherein the loader is configured to rearrange within the words in an order format for the turbo decoder engines to later read the words by providing the LLRs required for each of the turbo decoder engines.

3. A turbo decoder according to claim 1, further comprising a splitter operatively coupled to the systematic memory and the parity memory and configured to read therefrom and split so read systematic data and parity data into sub-words corresponding to respective ones of the plurality of turbo decoder engines.

4. A turbo decoder according to claim 3,
   wherein the splitter is configured to perform more read operations from the systematic memory than the loader performs write operations; and
   wherein the splitter is configured to perform more read operations from the parity memory than the loader performs write operations.

5. A turbo decoder according to claim 4, wherein the loader is configured to rearrange within the words in an order format for the turbo decoder engines to later read the words by providing the LLRs required for each of the turbo decoder engines.

6. A turbo decoder according to claim 3,
   wherein the loader is configured to perform more transformations before a write to the systematic memory than the splitter performs transformations after a read from the systematic memory because of how the loader rearranged data for storage in the systematic memory; and
   wherein the loader is configured to perform more transformations before a write to the parity memory than the splitter performs transformations after a read from the parity memory because of how the loader rearranged data for storage in the parity memory.

7. A turbo decoder according to claim 6, wherein the loader is configured to rearrange within the words in an order format for the turbo decoder engines to later read the words by providing the LLRs required for each of the turbo decoder engines.

8. A turbo decoder according to claim 1, wherein the loader is configured to rearrange the LLRs before writing them to the systematic memory and the parity memory in a way optimized for efficient read operations for processing by the turbo decoder engines.

9. A turbo decoder according to claim 1, wherein the loader is configured to store the LLRs into a corresponding one of the systematic memory and the parity memory rearranged within rows and at row addresses in a form and order for the turbo decoder engines to later read the LLRs optimized for maximum a posterior (MAP) processes.

10. A turbo decoder according to claim 9,
    wherein the turbo decoder is configured to calculate extrinsics during even and odd maximum a posterior (MAP) processes that occur at different times; and
    wherein during the even and odd maximum a posterior (MAP) processes, one of the systematic memory and the parity memory is configured to be idle.

11. A method of decoding comprising the steps of:
    (a) storing systematic data in words in a systematic memory;
    (b) storing parity data in words in a parity memory;
    (c) decoding in parallel the systematic data read from words of the systematic memory and the parity data read from words of the parity memory;
    (d) receiving logarithms of likelihood ratios (LLRs); and
    (e) separating the LLRs received in said receiving step (d) into systematic data and parity data, and storing the systematic data into a portion of one of the first words per cycle to fill the first words in the systematic memory over the cycles, and storing the parity data into a portion of one of the second words per cycle to fill the second words in the parity memory over the cycles; and
    (f) wherein the decoding of said step (c) reads the LLRs from one word of the systematic memory and one word of the parity memory in a single cycle.

12. A method of decoding according to claim 11, wherein said step (e) of separating comprises the substep of (d)(1)

rearranging the LLRs within the words in an order format for said step (c) of parallel decoding to later read the words by providing the LLRs required by each parallel decoding of said step (c).

13. A method of decoding according to claim 12, wherein said step (e) of separating performs more read operations from the systematic memory than said step (e) performs write operations and performs more read operations from the parity memory than said step (e) performs write operations.

14. A method of decoding according to claim 12, wherein said step (e) of separating performs more transformations before a write to the systematic memory than said step (e) performs transformations after a read from the systematic memory and performs more transformations before a write to the parity memory than said step (e) performs transformations after a read from the parity memory, because of how said step (e) rearranged data for storage in the systematic memory and in the parity memory.

15. A method of decoding according to claim 11, further comprising the step of (g) splitting systematic data and parity data read from the systematic memory and the parity memory into sub-words corresponding to respective parallel decoding steps of said step (c).

16. A method of decoding according to claim 11, wherein said step (e) of separating rearranges the LLRs before writing them to the systematic memory and the parity memory in a way optimized for efficient read operations for processing by the decoding of said step (c).

17. A method of decoding according to claim 11, wherein said step (e) of separating stores the LLRs into a corresponding one of the systematic memory and the parity memory rearranged within rows and at row addresses in a form and order for the decoding of said step (c) to later read the LLRs optimized for maximum a posterior (MAP) processes.

18. A method of decoding according to claim 17, wherein said step (c) of decoding further comprises the substep of (c)(1) calculating extrinsics during even and odd maximum a posterior (MAP) processes that occur at different times.

19. A method of decoding according to claim 18, wherein said method of decoding further comprises the step of (g) idling one of the systematic memory and the parity memory during the even and odd maximum a posterior (MAP) processes to save power.

20. A turbo decoder according to claim 1, wherein each LLR is represented by $[xl_k, zl_k, zl'_k]$, and the loader separates each LLR into the systematic data, which comprises $[xl_k, zl_k]$, and into the parity data, which comprises $[zl'_k]$, where $xl_k$ are the LLRs for original $x_k$ bits, $zl_k$ are the LLRs for original $z_k$ bits, $zl'_k$ are the LLRs for the original $z'_k$ bits, $x_k$, are input bits to a corresponding turbo encoder, and $z_k$ and $z'_k$ is redundant information derived using an interleaving sequence.

21. A method of decoding according to claim 11, wherein each LLR is represented by $[xl_k, zl_k, zl'_k]$, and in the step of separating, each LLR is separated into the systematic data, which comprises $[xl_k, zl_k]$, and into the parity data, which comprises $[zl'_k]$, where $xl_k$ are the LLRs for original $x_k$ bits, $zl_k$ are the LLRs for original $z_k$ bits, $zl'_k$ are the LLRs for the original $z'_k$ bits, $x_k$, are input bits to a corresponding turbo encoder, and $z_k$ and $z'_k$ is redundant information derived using an interleaving sequence.

* * * * *